(12) United States Patent
Liu et al.

(10) Patent No.: US 10,276,560 B2
(45) Date of Patent: Apr. 30, 2019

(54) PASSIVE DEVICE STRUCTURE AND METHODS OF MAKING THEREOF

(71) Applicant: GLOBALFOUNDRIES Inc., Grand Cayman (KY)

(72) Inventors: Bingwu Liu, Clifton Park, NY (US); Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1 day.

(21) Appl. No.: 15/638,850

(22) Filed: Jun. 30, 2017

(65) Prior Publication Data
US 2019/0006350 A1    Jan. 3, 2019

(51) Int. Cl.
*H01L 27/06*    (2006.01)
*H01L 21/8234*    (2006.01)

(52) U.S. Cl.
CPC .. *H01L 27/0629* (2013.01); *H01L 21/823418* (2013.01); *H01L 21/823431* (2013.01); *H01L 21/823475* (2013.01)

(58) Field of Classification Search
CPC ..... H01L 21/823418; H01L 21/823431; H01L 21/823475; H01L 27/0629
USPC ......................................................... 257/379
See application file for complete search history.

(56) References Cited

U.S. PATENT DOCUMENTS

| 2015/0048453 | A1* | 2/2015 | Ching | H01L 29/7856 257/347 |
| 2015/0097220 | A1 | 4/2015 | Ponoth et al. | |
| 2016/0005656 | A1* | 1/2016 | Ching | H01L 21/823821 438/283 |
| 2016/0126142 | A1 | 5/2016 | Chen et al. | |

FOREIGN PATENT DOCUMENTS

TW    201628087 A    8/2016

OTHER PUBLICATIONS

Taiwan Intellectual Property Office, Examination Report received in Taiwanese Patent Application No. 107113831 dated Oct. 15, 2018 and translation thereof.

* cited by examiner

*Primary Examiner* — Fernando L Toledo
*Assistant Examiner* — Adam S Bowen
(74) *Attorney, Agent, or Firm* — Thompson Hine LLP; Francois Pagette

(57) ABSTRACT

Structures for a passive device of an integrated circuits and associated fabrication methods. A semiconductor substrate having raised fins and an dielectric isolation layer between the fins is formed. An etch stop layer is formed over the dielectric isolation layer between fins of a passive device. An interlayer dielectric layer is formed over the fins and etch stop layer. The interlayer dielectric layer is selectively etched to form an opening for conductive contact to the fins, where the etch stop layer prevents etching of the dielectric isolation layer. A conductive contact is formed to contact the plurality of fins, with the conductive contact terminating at the etch stop layer.

20 Claims, 10 Drawing Sheets

US 10,276,560 B2

PASSIVE DEVICE STRUCTURE AND METHODS OF MAKING THEREOF

BACKGROUND

The present invention relates to semiconductor device fabrication and integrated circuits and, more specifically, to structures including passive device structures and methods for fabricating passive devices.

Diodes, capacitors, and resistors are passive devices in an integrated circuit that are incapable of switching electric currents. A diode, for example, may include two adjacent doped regions in a semiconductor wafer, in which the two doped regions have opposite conductivity types, to define a p-n junction.

In integrated circuit structures that include fin-type field-effect transistor (FinFET) devices, a passive device such as a diode may also include a plurality of fins that contact a conductive contact. Fins may be electrically isolated by an isolation dielectric material, but during fabrication some portion of the isolation material may be etched, and if the etching process is not well controlled some portions of the isolation material may be etched too deeply. When the conductive contact is formed it can penetrate into these deeply etched areas of the isolation material, degrading electrical isolation and causing current leakage in the device. As integrated circuit devices have continued to shrink, ensuring that current leakage and electrical short circuits are prevented has become an increasingly important consideration in fabrication processes.

SUMMARY

In an embodiment of the invention, a structure has a dielectric isolation layer and a conformal dielectric layer disposed on the dielectric isolation layer. The structure includes a passive device that has a semiconductor body and a plurality of fins extending from the semiconductor body through the dielectric isolation layer and through the conformal dielectric layer. A conductive contact is disposed on the plurality of fins and the conformal dielectric layer, with the conductive contact connected with the plurality of fins and terminating at the conformal dielectric layer between the plurality of fins.

In an embodiment of the invention, a method includes forming an etch stop layer arranged on a dielectric isolation layer between a plurality of fins of a passive device. An interlayer dielectric layer is deposited on the plurality of fins and the etch stop layer, and the interlayer dielectric layer is etched to form an opening revealing the plurality of fins and terminating on the etch stop layer. A conductive contact is formed in the opening, with the conductive contact connected with the plurality of fins.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIGS. 1-7A are cross-sectional views of a structure at successive fabrication stages of a processing method in accordance with embodiments of the invention.

DETAILED DESCRIPTION

FIGS. 1-8B depict an embodiment of a method for fabricating a structure 10 including a passive device 100. Throughout FIGS. 1-8B, structure 10 is depicted as including an active device 105, such as a FinFET device, formed on another portion of structure 10. Processes for fabricating integrated circuit devices and structures are frequently set up to simultaneously fabricate portions of different devices in an integrated circuit in the same fabrication steps, such as to protect one device (or multiple similar devices) from a fabrication process being carried out on another device of the same structure. The processes described herein and depicted in FIGS. 1-8B may be carried out with or without regard to other elements of structure 10, such as device 105, to form a passive device such as embodiments of passive device 100 depicted.

Figure 1:
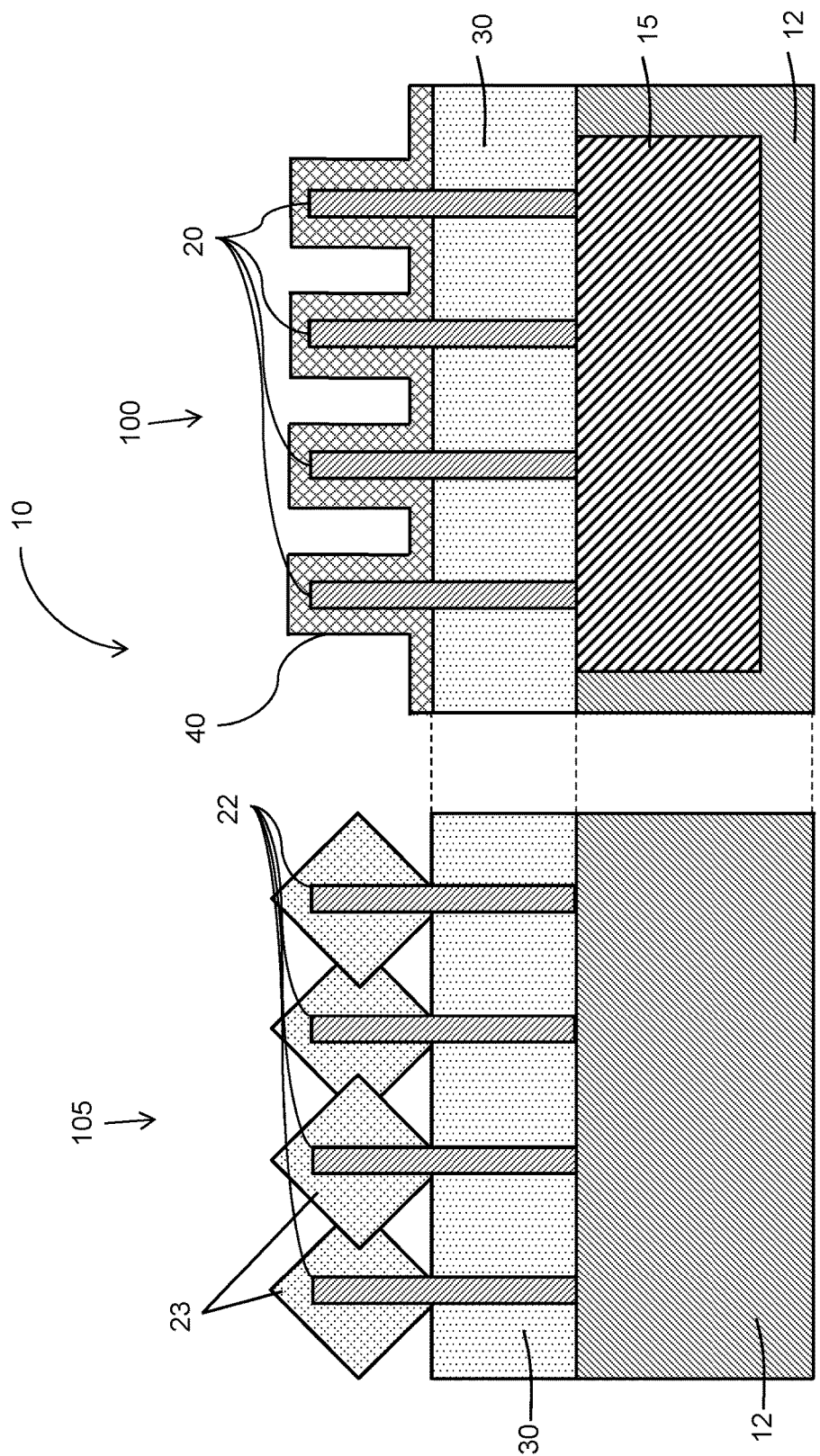

With reference to FIG. 1 and in accordance with embodiments of the invention, a structure 10 has a passive device 100 and a fin-type field-effect transistor device 105, also called a FinFET device 105, over a semiconductor substrate 12. Passive device 100 has a plurality of fins 20 extending above semiconductor substrate 12 and FinFET device 105 also has a plurality of fins 22 projecting from the semiconductor substrate 12. The fins 20, 22 may be formed from the material of semiconductor substrate 12 by, for example, photolithography and etching processes such as a sidewall imaging transfer (SIT) process. A dielectric isolation layer 30 is disposed between the fins 20, 22 so that the fins 20, 22 extend from substrate 12 through dielectric isolation layer 30. Dielectric isolation layer 30 may be a dielectric material such as an oxide of silicon (e.g., silicon dioxide ($SiO_2$)) deposited by, for example, chemical vapor deposition (CVD). Passive device 100 also includes a well 15 having a conductivity type such as n-type. Well 15 may be, for example, an n-well if the region is doped with an n-type dopant such as phosphorous.

FIG. 1 also depicts passive device 100 following deposition of a conformal dielectric layer 40 over fins 20 and dielectric isolation layer 30, and FinFET device 105 following epitaxial growth of a semiconductor material over fins 22 to form raised fin structures 23. The conformal dielectric layer 40 may be a nitride material, such as silicon nitride, or a low-k dielectric material like silicon oxycarbonitride (SiOCN). A low-k dielectric material is generally any dielectric with a dielectric constant k that is less than the dielectric constant of silicon dioxide. The dielectric isolation layer 30 may have a different etch selectivity from the conformal dielectric layer 40, whether the conformal dielectric layer 40 is a nitride material, a low-k dielectric material, or an alternative dielectric material. The conformal dielectric layer 40 may be deposited by any process that ensures that conformal dielectric layer 40 has a substantially uniform thickness over the fins 20 and dielectric isolation layer 30, such as by chemical vapor deposition (CVD) or atomic layer deposition (ALD). Forming of raised fin structures 23 by epitaxial growth of semiconductor materials, such as silicon or silicon-germanium (SiGe), over fins 22 may be used to define source/drain regions of FinFET device 105. In exemplary embodiments, the epitaxial deposition and growth process may be controlled to continue forming raised fin structures 23 until the raised fin structures 23 merge together, as depicted in FIG. 1. Merging of raised fin structures 23 provides a larger surface area on which to land conductive contacts.

In an embodiment, passive device 100 may be masked during the epitaxial growth of the semiconductor material over fins 22 of the FinFET device 105, with the conformal dielectric layer 40 being deposited over fins 20 after raised fin structures 23 have been formed. In one example, raised fin structures 23 may be masked to prevent deposition of the conformal dielectric layer 40 on raised fin structures 23. In another example, the conformal dielectric layer 40 may be deposited over raised fin structures 23 as well as fins 20, and selectively etched off of raised fin structures 23. In another embodiment, conformal dielectric layer 40 may be deposited over fins 20 prior to epitaxially growing a semiconductor material over fins 22, so that conformal dielectric layer 40 prevents epitaxial growth of the semiconductor material over fins 20 as semiconductor materials do not nucleate over dielectric materials.

Figure 2:
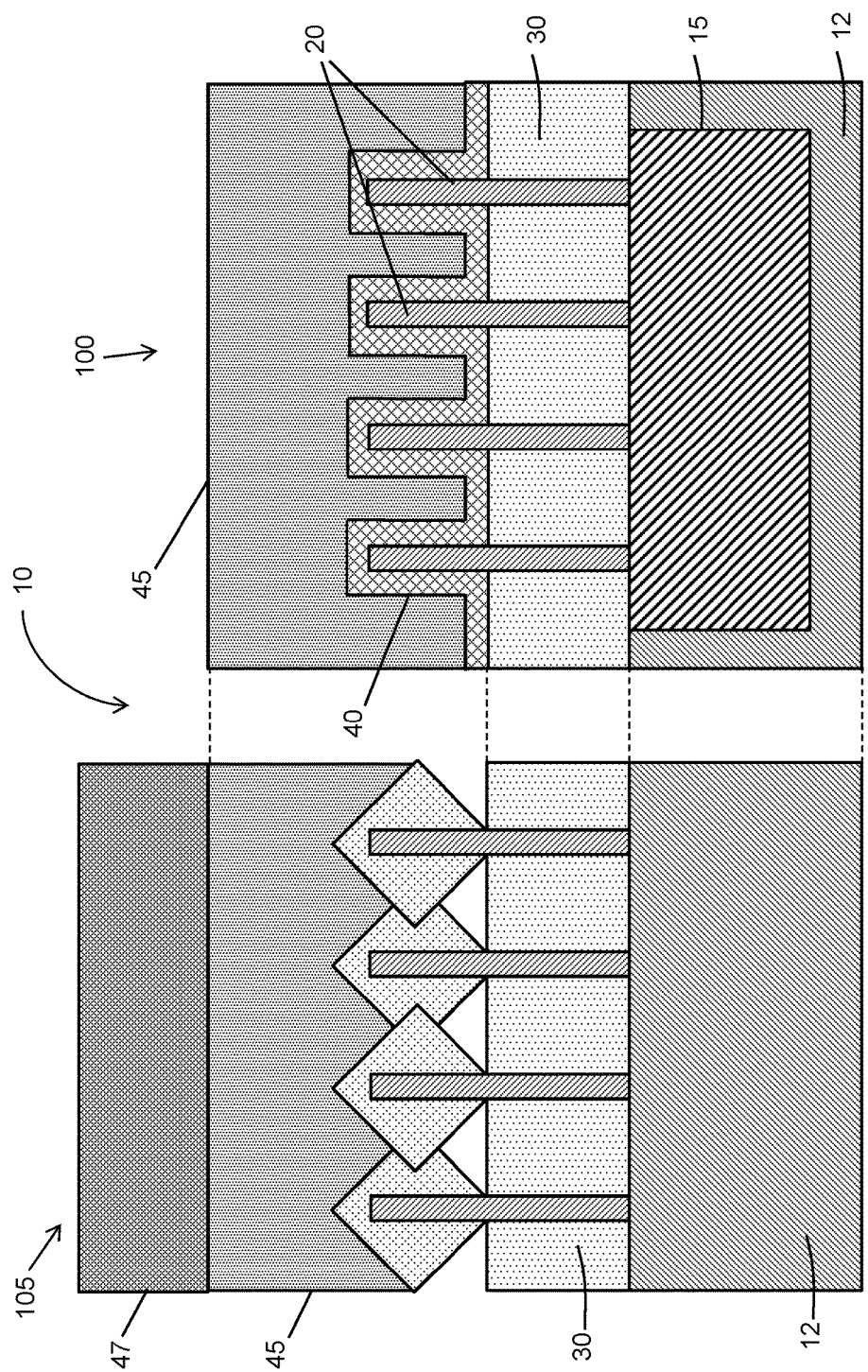

With reference to FIG. 2 in which like reference numerals refer to like features in FIG. 2 and at a subsequent fabrication stage, a sacrificial layer 45 is deposited on passive device 100 as well as on FinFET device 105. Sacrificial layer 45 may be, for example, a spin-on hardmask such as an organic planarization layer (OPL) and may be provided by any process, such as a spin coating process. Further, a masking layer 47 is deposited on the portion of sacrificial layer 45 covering FinFET device 105. Masking layer 47 may include any material capable of protecting sacrificial layer 45 from subsequent etching or recessing processes, as described further below, such as a lithography stack having one or more masking material layers. For example, a lithography stack may include an anti-reflective coating and a layer of photoresist, in addition to other lithography masking layers. Masking layer 47 may be selectively provided over the portion of sacrificial layer 45 over FinFET device 105.

Figure 3:
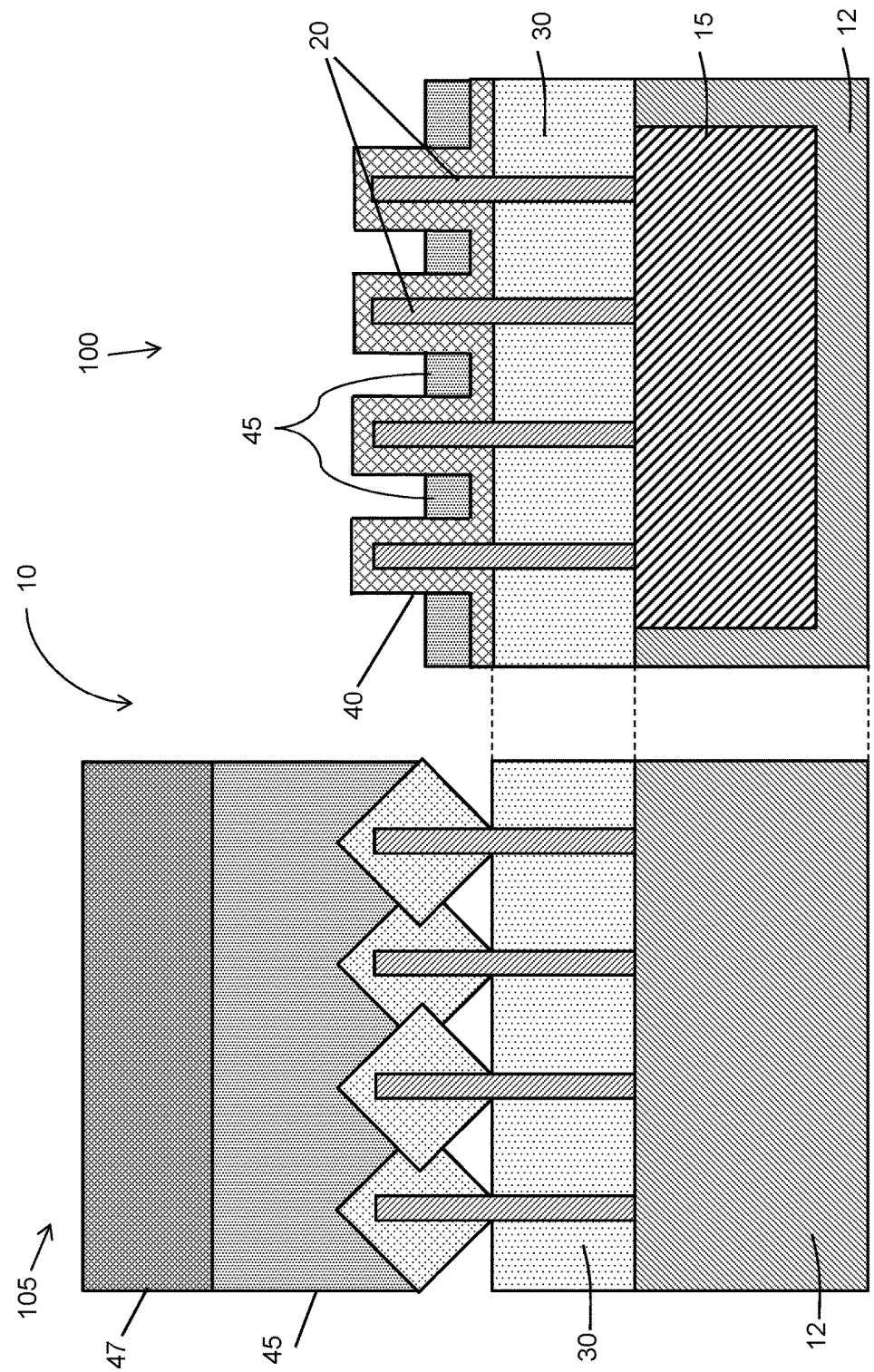

With reference to FIG. 3 in which like reference numerals refer to like features in FIG. 2 and at a subsequent fabrication stage, structure 10 is shown following recessing of sacrificial layer 45 below top surfaces of fins 20. Recessing of sacrificial layer 45 may be carried out by any process capable of selectively remove sacrificial layer 45, such as an etch-back using a reactive-ion etching (RIE) process. The recessing may be controlled to terminate when the sacrificial layer 45 has reached a pre-determined reduced thickness, and the remaining sacrificial layer 45 remains over portions of conformal dielectric layer 40 between adjacent pairs of fins 20. Masking layer 47 masks the sacrificial layer 45 over FinFET device 105 during the recessing.

Figure 4:
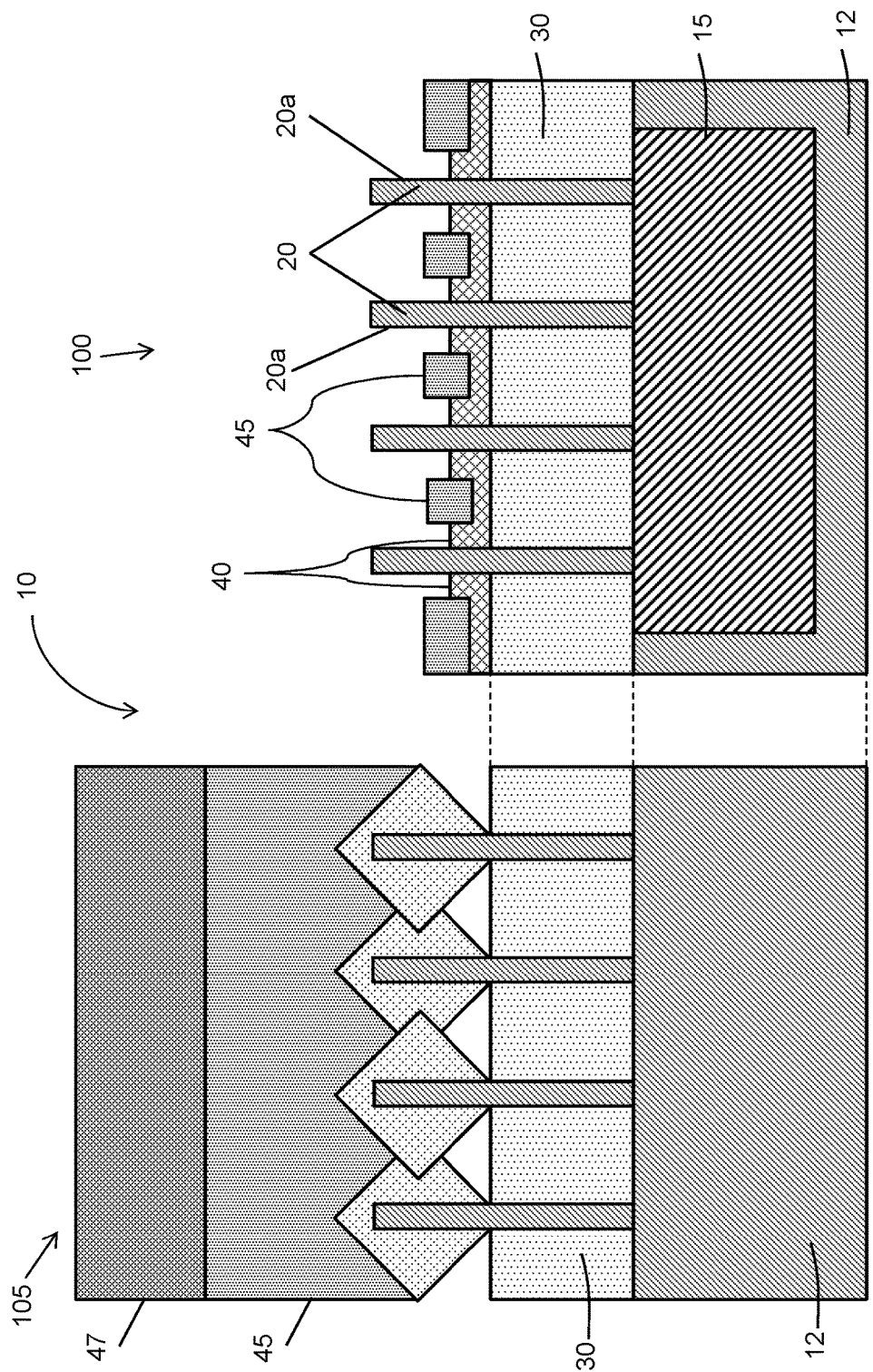

With reference to FIG. 4 in which like reference numerals refer to like features in FIG. 3 and at a subsequent fabrication stage, the conformal dielectric layer 40 is removed from the top surface and the sidewalls 20a of the fins 20 to expose upper portions of fins 20. The removal may be performed by a selective etch process that selectively removes the dielectric material of the conformal dielectric layer 40 without etching the recessed sacrificial layer 45 and without etching the semiconductor material of fins 20. In one embodiment, the etching process may be an anisotropic dry etch process, such as a reactive-ion etching (RIE) process. The etch process may be controlled to terminate when a sufficient portion of fins 20 have been exposed through the etch process and before portions of conformal dielectric layer 40 between sacrificial layer 45 and fins 20 are etched. In one example, the etch process may be controlled to terminate when a remaining portion of conformal dielectric layer 40 has a thickness substantially equal to the selected thickness of recessed sacrificial layer 45. The etch process may, for example, be controlled by timing the etch process to last for a predetermined duration. Masking layer 47 masks the FinFET device 105 during the etching.

Figure 5:
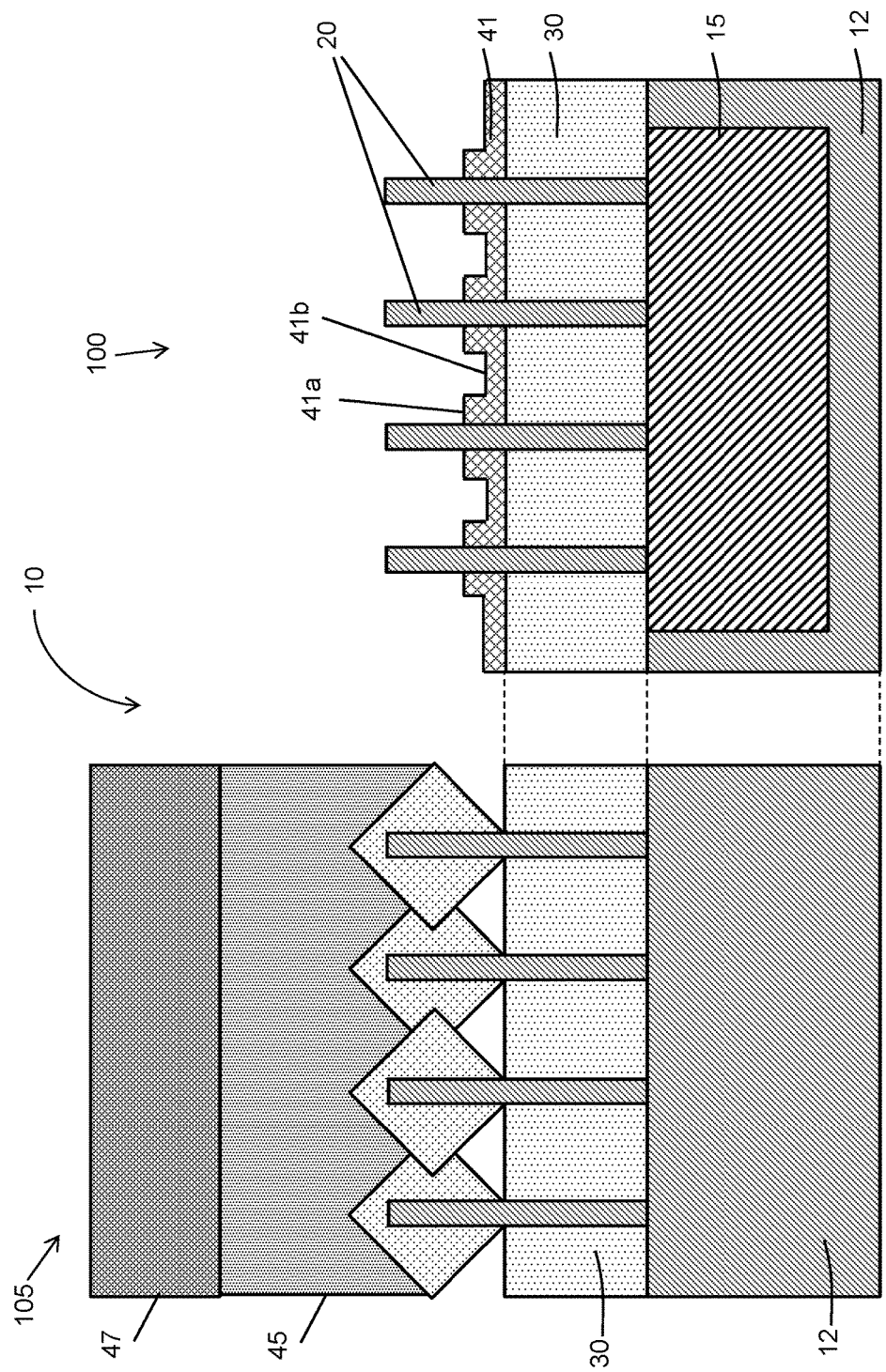

With reference to FIG. 5 in which like reference numerals refer to like features in FIG. 4 and at a subsequent fabrication stage, the remaining sacrificial layer 45 is removed from over the remaining portions of conformal dielectric layer 40, so that remaining portions of the conformal dielectric layer form an etch stop layer 41. As FIG. 5 depicts, masking layer 47 continues to protect the portion of sacrificial layer 45 over FinFET device 105 while sacrificial layer 45 is removed from over passive device 100. In alternative embodiments, the remaining sacrificial layer 45 on passive device 100 may be retained through subsequent processing stages, as described below, with the remaining sacrificial layer 45 and the portion of sacrificial layer 45 over FinFET device 105 being removed in a single removal step, as described below. As FIG. 5 illustrates, as a result of the processes described herein etch stop layer 41 is disposed in spaces between the fins 20 associated with passive device 100, and may have a greater thickness 41a near or contacting fins 20 and a lower thickness 41b between pairs of fins 20.

Figure 6:
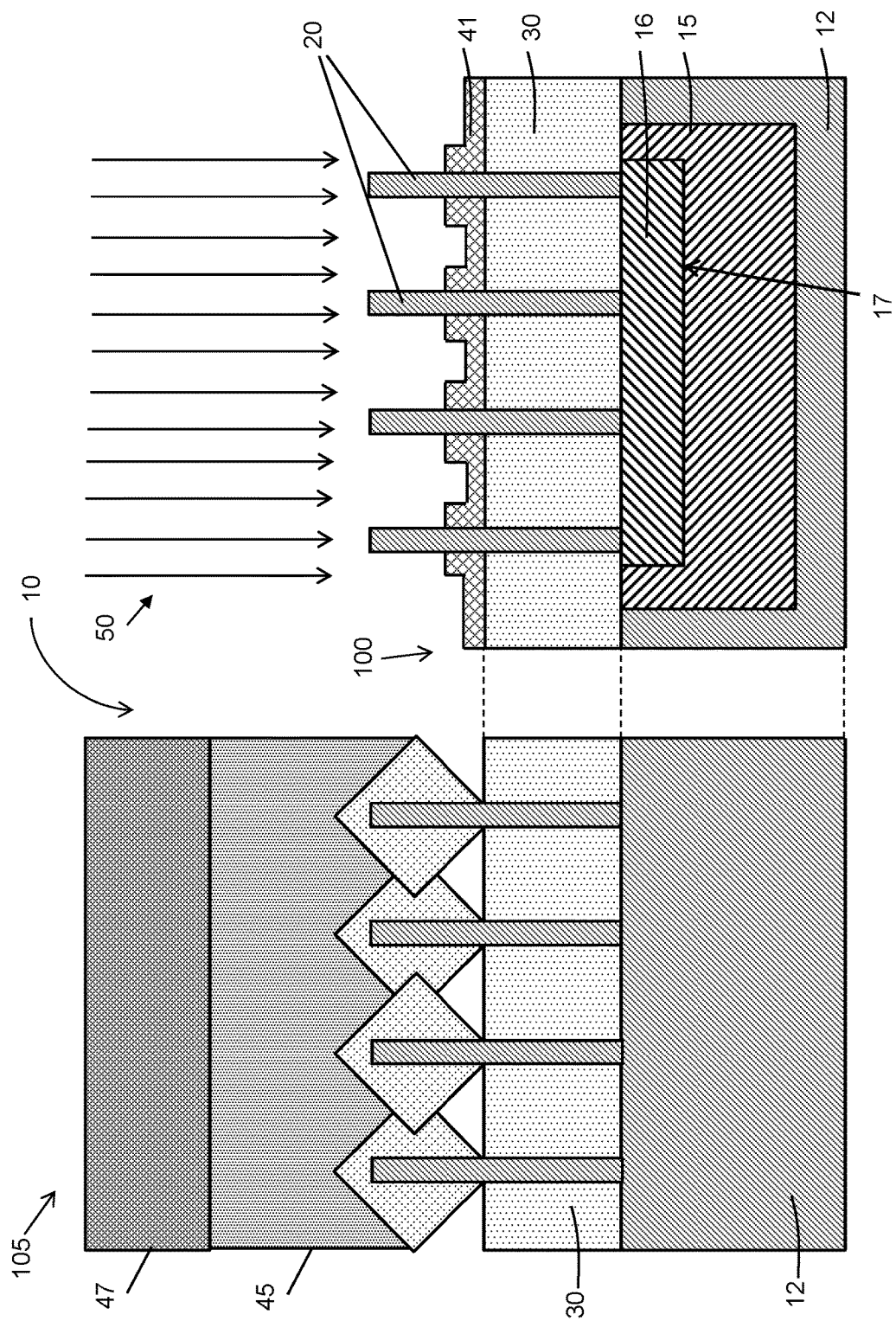

With reference to FIG. 6 in which like reference numerals refer to like features in FIG. 5 and at a subsequent fabrication stage, passive device 100 is implanted with ions, generally indicated by reference numeral 50, of a dopant to form a doped region 16 within the well 15. Masking layer 47 may block implantation of the dopant so that the dopant does not penetrate into any portion of FinFET device 105, and only implants into portions of passive device 100. The dopant provides the semiconductor material of doped region 16 with a conductivity type opposite the conductivity type of the semiconductor material well 15. In one embodiment, the dopant may be a p-type dopant such as boron. As the doped region 16 and well 15 have opposite conductivity types, the doped region 16 and the well 15 adjoin along a p-n junction 17. Fins 20 may also be implanted 50 with the dopant during this stage, so that fins 20 and doped region 16 share the same conductivity type.

Figure 7A:
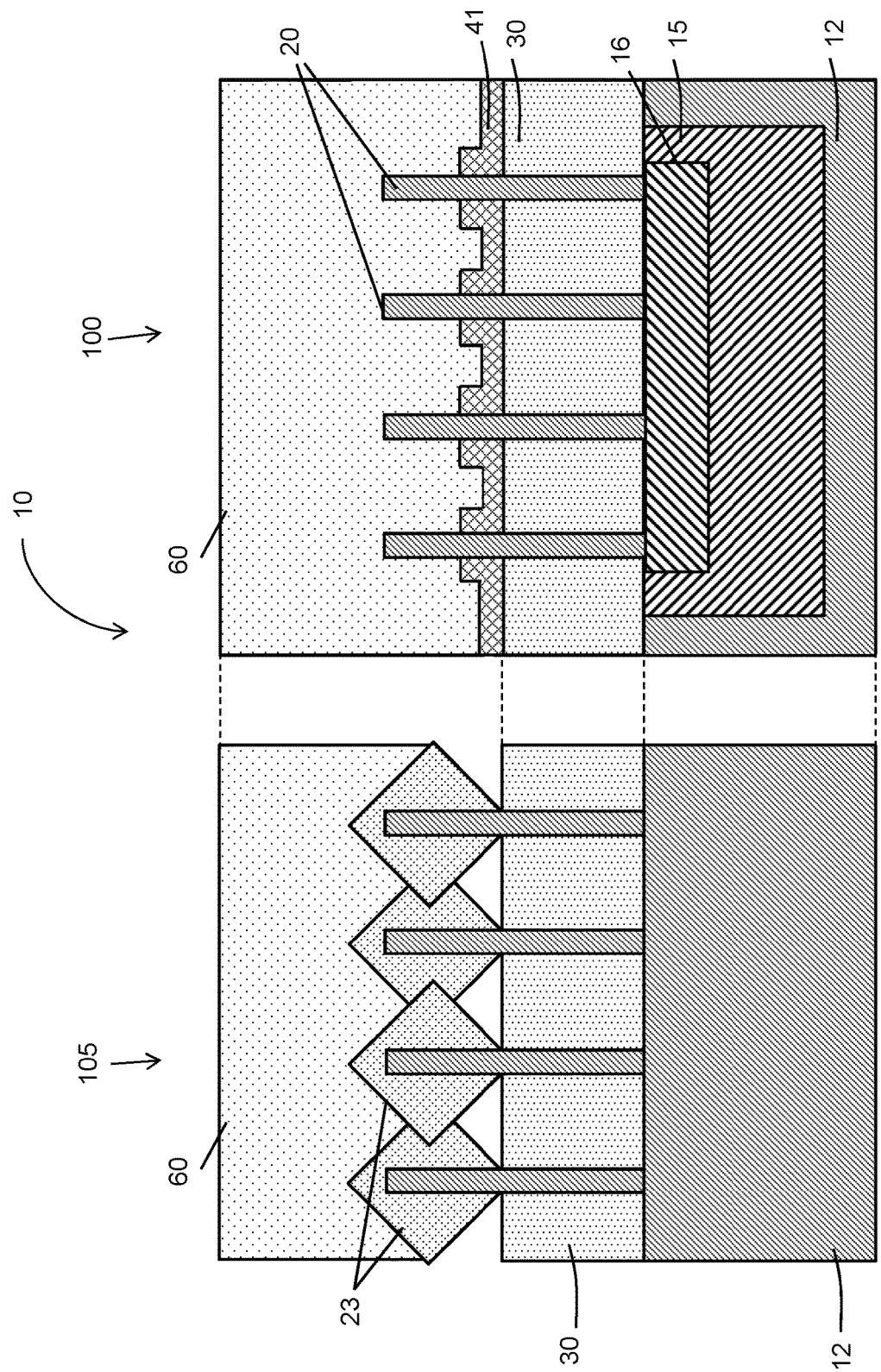
Figure 7B:
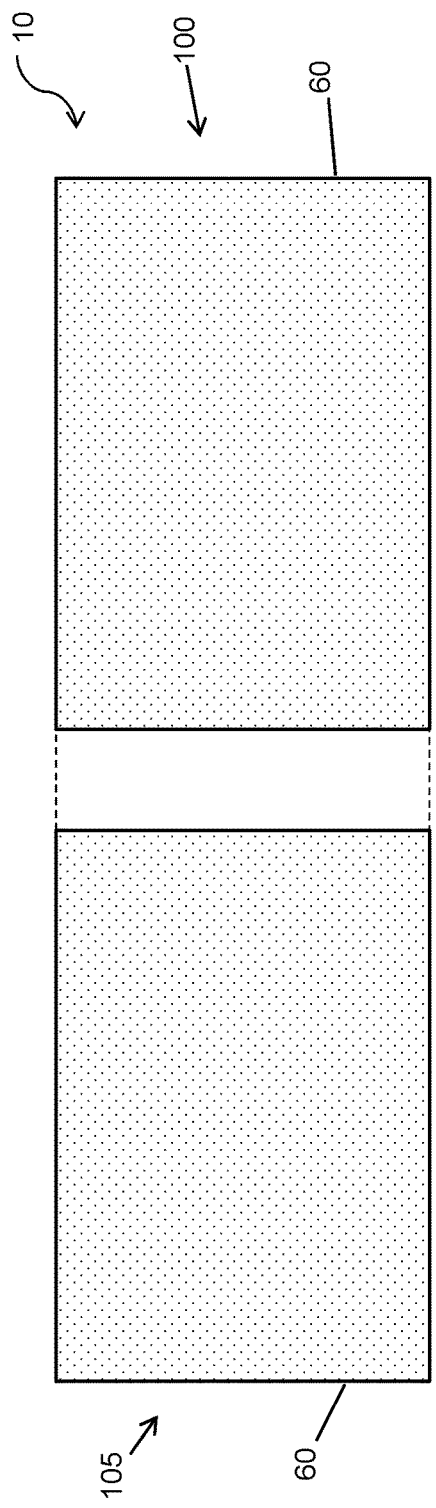
FIGS. 7B and 7C are top views of the structure at successive fabrication stages subsequent to FIG. 7A.

With reference to FIG. 7A and FIG. 7B in which like reference numerals refer to like features in FIG. 6 and at a subsequent fabrication stage, masking layer 47 and remaining portions of sacrificial layer 45 are removed from over FinFET device 105, and an interlayer dielectric layer 60 is deposited over structure 10. In exemplary embodiments, the interlayer dielectric layer 60 may be an oxide material, such as silicon dioxide, and may be the same material or a similar material as dielectric isolation layer 30.

Figure 7C:
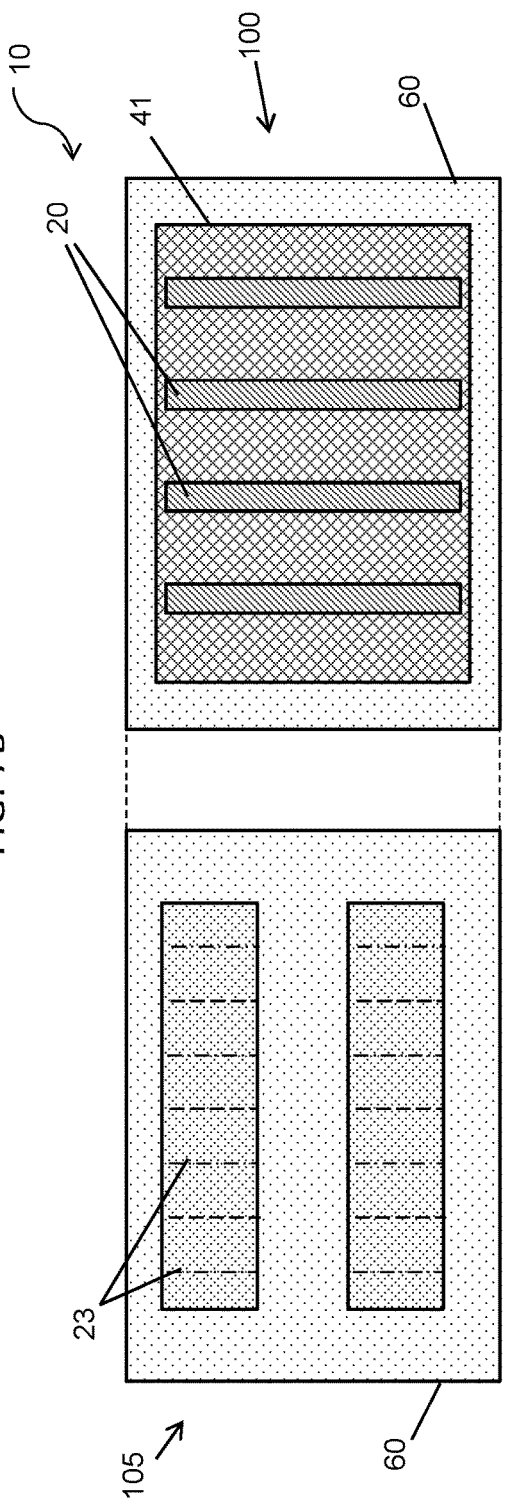

With reference to FIG. 7C in which like reference numerals refer to like features in FIGS. 7A and 7B and at a subsequent fabrication stage, interlayer dielectric layer 60 may be selectively etched, such as by a photolithographic etch process, to form openings to reveal passive device 100 and reveal source/drain regions defined by the raised fin structures 23 of FinFET device 105, and allow for conductive contact to the exposed portions, as described below, while leaving other portions of interlayer dielectric layer 60 intact so that portions of structure 10 below interlayer dielectric layer 60 may remain electrically isolated from a conductive contact 70. The etch process may be any etching process that selectively etches portions of interlayer dielectric layer 60 without etching the material of etch stop layer 41, such as an etching process that is selective to oxide materials, so that etching of the opening over passive device 100 terminates at etch stop layer 41. Thus, interlayer dielectric layer 60 may be safely removed from over passive device 100 without the etching process undesirably etching portions of dielectric isolation layer 30, which may otherwise result in insufficient insulation material remaining between adjacent fins 20 and/or insufficient electrical isolation between a conductive contact, such as conductive contact 70 depicted in FIG. 8A and FIG. 8B, and semiconductor substrate 12 of the passive device 100. The openings formed by the selective etch process may be concurrently formed within the same etch process.

Figure 8A:
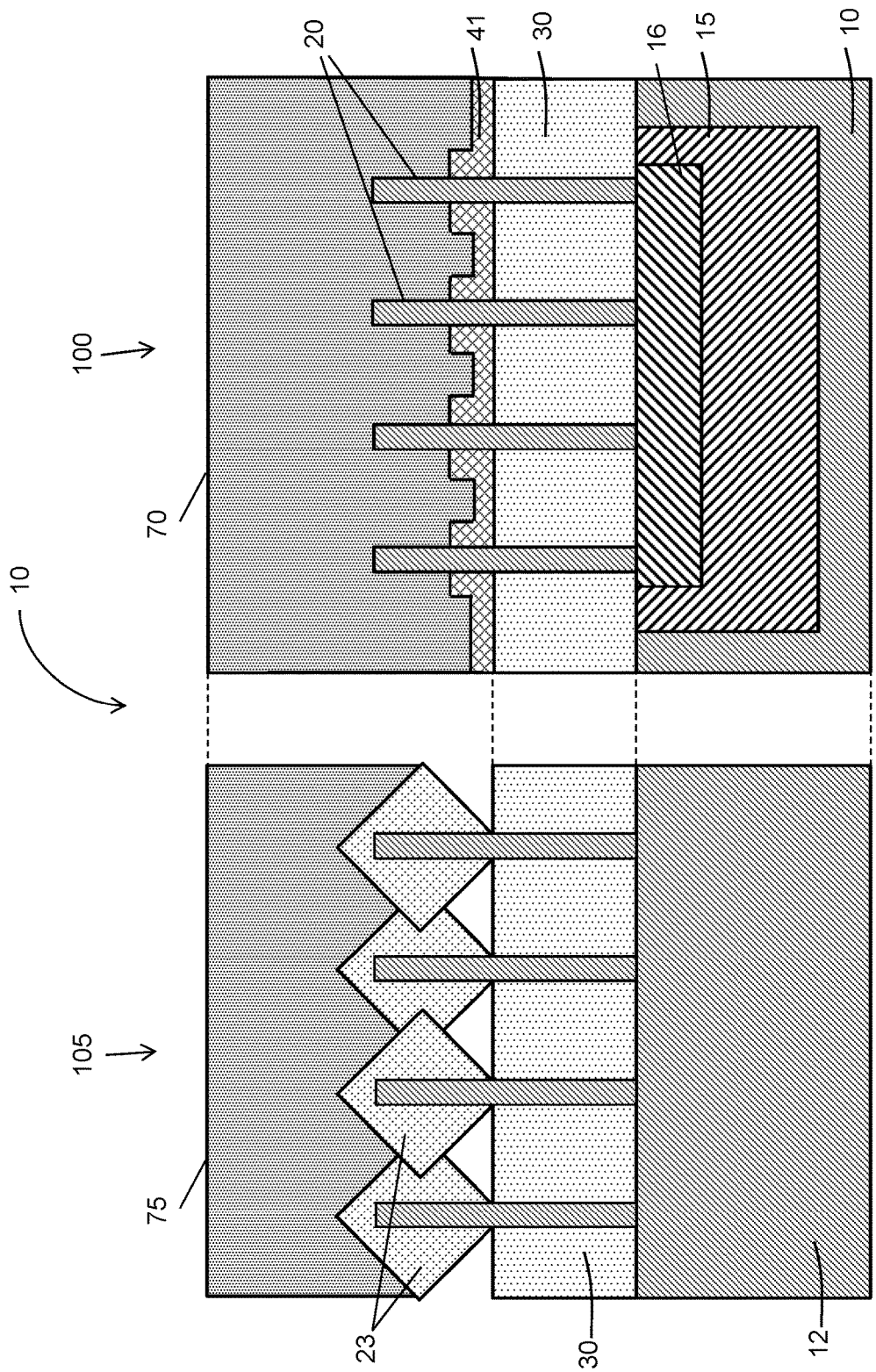
FIGS. 8A-8B are respectively a cross-sectional view and top view of the structure at a fabrication stage subsequent to FIG. 7C.
Figure 8B:
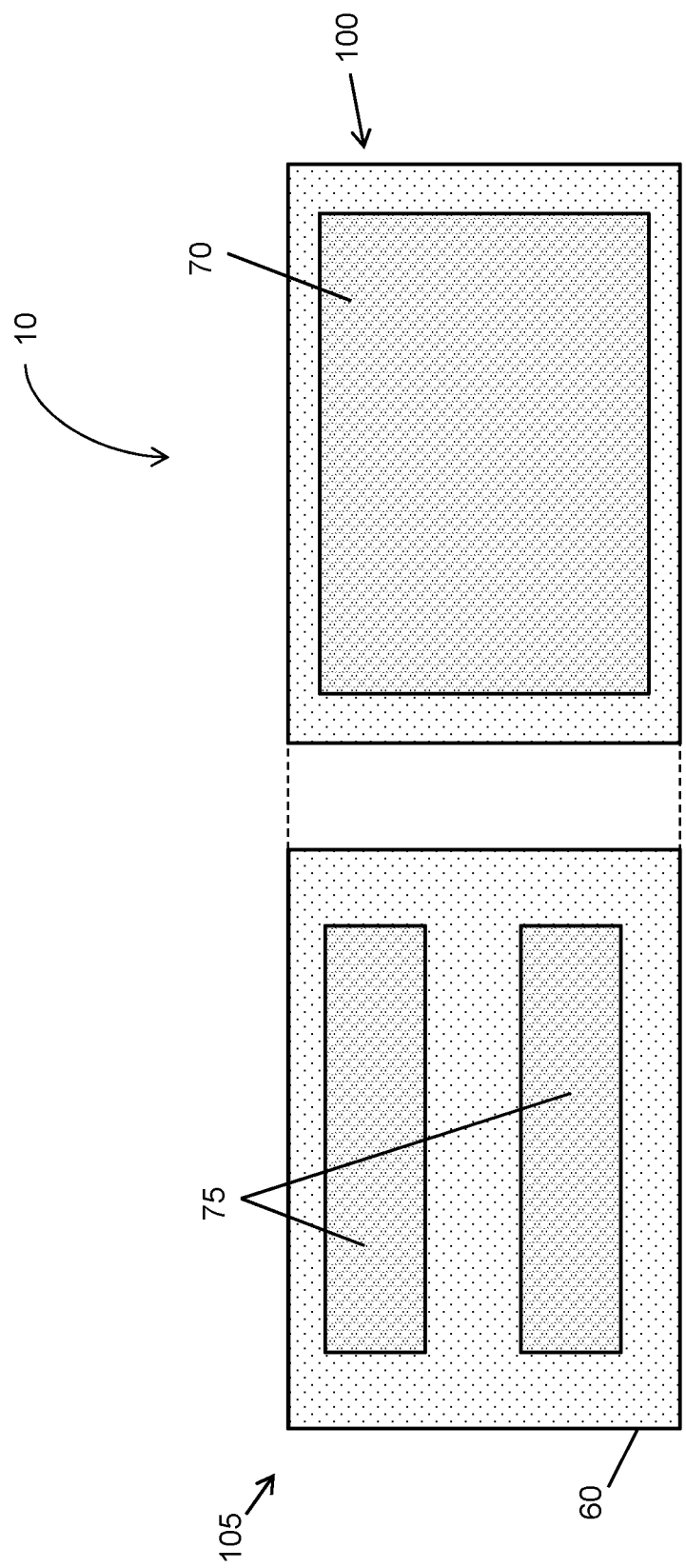

With reference to FIGS. 8A and 8B in which like reference numerals refer to like features in FIGS. 7A-7C and at a subsequent fabrication stage, a conductive contact 70 is provided over the plurality of fins 20 of passive device 100 and another conductive contact 75 over the raised fin structures 23 constituting source/drain region(s) 23 of FinFET device 105. Conductive contact 70 may, in an embodiment, directly contact fins 20 of passive device 100. Similarly, the other conductive contact 75 may, in an embodiment, directly contact raised fin structures 23 of FinFET device 105. Conductive contacts 70, 75 may be formed in part, for example, by silicidation of a silicide-forming metal, such as cobalt or nickel, and the semiconductor material at top surfaces of the plurality of fins 20 and/or top surfaces of raised fin structures 23 contacting the silicide-forming metal. A silicidation process may involve one or more annealing steps to form a silicide phase by reacting the silicide-forming metal with the semiconductor material of fins 20 and/or raised fin structures 23, forming a metal silicide layer of conductive contact 70. In an embodiment, the conductive contact may further include a metal material, such as tungsten, that is deposited over the metal silicide layer.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a dielectric isolation layer;
   a conformal dielectric layer disposed on the dielectric isolation layer;
   a passive device including a semiconductor body and a plurality of fins extending from the semiconductor body through the dielectric isolation layer and through the conformal dielectric layer; and
   a first conductive contact disposed on the plurality of fins and the conformal dielectric layer, the first conductive contact connected with the plurality of fins and terminating at the conformal dielectric layer between the plurality of fins.

2. The structure of claim 1 wherein the passive device includes a well formed in the semiconductor body and a doped region within the well, the well has a first conductivity type, the doped region has a second conductivity type opposite the first conductivity type, the doped region and the well adjoin along a p-n junction, the doped region is disposed between the plurality of fins and the well, and the plurality of fins are connected with the doped region.

3. The structure of claim 2 wherein the plurality of fins have the second conductivity type.

4. The structure of claim 1 wherein the conformal dielectric layer is a nitride material, and the dielectric isolation layer is an oxide material.

5. The structure of claim 1 wherein the conformal dielectric layer is low-k dielectric material, and the dielectric isolation layer is an oxide material.

6. The structure of claim 1 wherein the conformal dielectric layer has a first thickness near or contacting the plurality of fins and a second thickness between adjacent pairs of the plurality of fins.

7. The structure of claim 1 further comprising:
   a fin-type field-effect transistor device including a plurality of fins and a plurality of raised fin structures formed on the plurality of fins, the plurality of raised fin structures defining a source/drain region; and
   a second conductive contact connected with the source/drain region.

8. The structure of claim 1 further comprising:
   an interlayer dielectric layer on the conformal dielectric layer,
   wherein the first conductive contact and the plurality of fins are arranged in an opening defined in the interlayer dielectric layer.

9. The structure of claim 1 wherein the first conductive contact is arranged in direct contact with the plurality of fins.

10. A method comprising:
    forming an etch stop layer arranged on a dielectric isolation layer in spaces between a first plurality of fins associated with a passive device;
    depositing an interlayer dielectric layer on the first plurality of fins and the etch stop layer;

etching the interlayer dielectric layer to form a first opening that reveals the first plurality of fins and that terminates on the etch stop layer; and forming a first conductive contact in the first opening that is connected with the first plurality of fins.

11. The method of claim 10 wherein each of the first plurality of fins includes one or more sidewalls, and forming the etch stop layer comprises:

depositing a conformal dielectric layer on the first plurality of fins and the dielectric isolation layer;

forming a sacrificial layer that masks portions of the conformal dielectric layer in the spaces between the first plurality of fins; and selectively etching the conformal dielectric layer to remove the conformal dielectric layer from the one or more sidewalls of the first plurality of fins, wherein the portions of the conformal dielectric layer form the etch stop layer.

12. The method of claim 11 wherein the conformal dielectric layer comprises a nitride material, and the interlayer dielectric layer is an oxide material having a different etch selectivity than the nitride material.

13. The method of claim 11 wherein the conformal dielectric layer comprises a low-k dielectric material, and the interlayer dielectric layer is an oxide material having a different etch selectivity than the low-k dielectric material.

14. The method of claim 11 wherein the first conductive contact is arranged to contact the one or more sidewalls of the first plurality of fins.

15. The method of claim 11 wherein forming the sacrificial layer comprises:

depositing the sacrificial layer on the conformal dielectric layer and the first plurality of fins; and recessing the sacrificial layer in the spaces between the first plurality of fins with an etch-back process.

16. The method of claim 11 further comprising:

forming the sacrificial layer on a second plurality of fins of a fin-type field-effect transistor device;

before the conformal dielectric layer is selectively etched, depositing a masking layer on the sacrificial layer over the fin-type field-effect transistor device, the masking layer arranged to mask the fin-type field-effect transistor device from the selective etching of the conformal dielectric layer; and after the conformal dielectric layer is selectively etched, removing the masking layer and the sacrificial layer from over the fin-type field-effect transistor device.

17. The method of claim 16 further comprising:

epitaxially growing a semiconductor material over at least a portion of the second plurality of fins to form raised fin structures, wherein the raised fin structures define a source/drain region of the fin-type field-effect transistor device.

18. The method of claim 17 wherein the interlayer dielectric layer is formed on the fin-type field-effect transistor device, and further comprising:

etching a second opening in the interlayer dielectric layer that reveals the source/drain region; and forming a second conductive contact in the second opening that is connected with the source/drain region, wherein the first opening and the second opening in the interlayer dielectric layer are concurrently etched.

19. The method of claim 10 wherein the passive device comprises a semiconductor body over a semiconductor substrate and a well formed in the semiconductor body, the well having a first conductivity type, and further comprising:

forming a doped region over the well after forming the etch stop layer, wherein the doped region has a second conductivity type opposite the first conductivity type.

20. The method of claim 19 wherein forming the doped region comprises:

implanting a dopant into the well.

* * * * *